(12) United States Patent
Miyashita et al.

(10) Patent No.: US 6,437,649 B2
(45) Date of Patent: Aug. 20, 2002

(54) MICROWAVE AMPLIFIER

(75) Inventors: Takumi Miyashita; Taisuke Iwai, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/822,235

(22) Filed: Apr. 2, 2001

(30) Foreign Application Priority Data

May 19, 2000 (JP) ........................................ 2000-147337

(51) Int. Cl.[7] ................................................ H03F 3/04
(52) U.S. Cl. ........................ 330/302; 330/296; 333/214
(58) Field of Search ............................... 330/296, 302, 330/136, 284, 285; 333/214, 215, 32, 173

(56) References Cited

U.S. PATENT DOCUMENTS

| | | | | |
|---|---|---|---|---|
| 3,068,424 A | * | 12/1962 | Orloff et al. | 330/40 |
| 3,345,578 A | * | 10/1967 | Shuda | 330/22 |
| 3,396,341 A | * | 8/1968 | Fange | 325/477 |
| 5,625,323 A | * | 4/1997 | Tozawa | 330/277 |

FOREIGN PATENT DOCUMENTS

| | | | | |
|---|---|---|---|---|
| JP | 63-54005 | * | 3/1988 | 330/302 |
| JP | 6-53761 | * | 2/1994 | 330/302 |
| JP | 2000-228613 | | 8/2000 | |

OTHER PUBLICATIONS

A Novel Distortion Compensation Technique Using an Active Inductor, IECE Trans. Electron., vol. E82–C, No. 5 May 1999.

* cited by examiner

*Primary Examiner*—Robert Pascal
*Assistant Examiner*—Henry Choe
(74) *Attorney, Agent, or Firm*—Armstrong, Westerman & Hattori, LLP

(57) ABSTRACT

A resistor is inserted in series with an inductor feeding a bias current and that reactance of an input matching circuit or of an output matching circuit is varied depending on variations of input signal power. The input impedance of the amplifying element is restrained from lowering even when the input signal power has increased so that a constantly satisfactory impedance matching is achieved irrespective of the input signal powers variations. Furthermore, restriction on increase of the bias current enables a limitation to be imposed on increase of the power consumption of the microwave amplifier.

5 Claims, 6 Drawing Sheets

MICROWAVE AMPLIFIER

BACKGROUND OF THE INVENTION

1. Field of the Invention

The present invention relates generally to a microwave amplifier transmitting high-speed digital modulated waves, and more particularly to a microwave amplifier for use in a cellular phone, a base station, etc., utilizing wideband code division multiple access (WCDMA) or orthogonal frequency division multiplexing (OFDM).

2. Description of the Related Art

Reference is now made to FIG. 8 which illustrates a circuit of a conventional microwave amplifier. The microwave amplifier is designated generally at 10 and comprises a transistor Qd in the form of, e.g., a bipolar junction transistor (BJT); an input matching circuit 11 connected to a base of the transistor Qd; and an output matching circuit 12 connected to a collector of the transistor Qd.

A microwave signal output from a signal source 13 passes through an internal impedance R1 of the signal source 13 and is input to an input terminal In of a microwave amplifier 10. The microwave signal input to the input terminal In is fed via the input matching circuit 11 to the base of the transistor Qd, with the resultant amplified microwave signal being fed from the collector of the transistor Qd though the output matching circuit 12 to a load R2 connecting with an output terminal Out.

The bipolar junction transistor for use in the microwave band has an input impedance including a resistance component and a reactance component. On the contrary, the internal impedance R1 (if a transmission line intervenes, its characteristic impedance) of the signal source 13 normally includes only the resistance component of 50 ohms. Hence, to ensure an effective feed of microwave signals from the signal source to the transistor Qd, the input matching circuit 11 effects an impedance matching.

The input matching circuit 11 of FIG. 8 is formed of a two-stage π circuit consisting of inductors L51, L52 and Lb and of capacitors C51 and C52. On the other hand, the impedance matching between the output impedance of the transistor Qd and the load R2 is effected by the output matching circuit 12 having the same configuration.

The input matching circuit 11 includes an inductor Lb whose one end is connected to a bias power source Vb2 to feed a bias current to the base of the transistor Qd. In this case, to raise the power efficiency of the microwave amplifier 10, it is desirable to cause the transistor Qd to effect a class B operation by which little or substantially no bias current flows across the base and emitter of the transistor Qd. Due to the output distortion which may increase in the class B operation, however, the transistor Qd is set to a class AB in which a slight bias current flows in the absence of signals.

In the conventional microwave amplifier in this manner, the input matching circuit 11 and the output matching circuit 12 effect the impedance matching between the input/output impedance of the transistor Qd and the external impedance.

However, the input/output impedance of the transistor may vary depending on the increase or decrease of the input signal power. For this reason, it will be difficult for the input matching circuit 11 and the output matching circuit 12 designed on the assumption that the transistor Qd has an unvaried input/output impedance to meet the matching conditions with the external impedance irrespective of the increase or decrease of the input signal power.

Accordingly as the input signal power increases, the base current increases and, depending on the diode characteristics across the base and emitter of the transistor Qd, the input impedance of the transistor Qd becomes smaller. As a result, the increased bias current allows the operation of the transistor Qd to shift from the class B operation to a class A operation. This results in an increased power consumption of the transistor Qd, which may place obstacles in power savings of battery-driven equipment such as cellular phones.

SUMMARY OF THE INVENTION

It is therefore an object of the present invention to provide a microwave amplifier capable of effecting a satisfactory impedance matching at all times irrespective of variations of the input signal power, to thereby ensure an effective feed of the input signal power to the amplifying element and suppress output signal distortions.

Another object of the present invention is to provide a microwave amplifier capable of restraining the input impedance from lowering even when the input signal power has increased to thereby impose a limitation on the increase in the power consumption of the amplifying element.

In order to achieve the above objects, an aspect of the present invention is characterized in that a resistor is inserted in series with an inductor feeding a bias current and that reactance of an input matching circuit or of an output matching circuit is varied depending on variations of input signal power. According to the present invention, the input impedance of the amplifying element is restrained from lowering even when the input signal power has increased so that a constantly satisfactory impedance matching is achieved irrespective of the input signal power variations. Furthermore, restriction on increase of the bias current enables a limitation to be imposed on increase of the power consumption of the microwave amplifier.

In order to attain the above objects, another aspect of the present invention is characterized by a microwave amplifier comprising a transistor arranged to amplify a microwave signal fed from a signal source to a base of the transistor; and a series circuit including an inductor and a resistor for feeding a bias current to the base of the transistor.

According to the present invention, due to the insertion of the resistor into a path for feeding a bias current to the base of the transistor, it is possible to restrict the increase of the bias current even when the input signal power has increased, whereupon a limitation is imposed on the lowering of the input impedance of the transistor as a result of the increased input signal power so that the impedance matching can be kept irrespective of the increase of the input signal power.

In order to attain the above objects, a further aspect of the present invention is characterized by a microwave amplifier comprising a first transistor arranged to amplify a microwave signal fed from a signal source to a base of the first transistor; and an input matching circuit in the form of an LC circuit interposed between the signal source and the base of the first transistor, the input matching circuit effecting an impedance matching between impedance of the signal source and input impedance of the first transistor, the input matching circuit including a first inductor and a first capacitance, either the first inductor or the first capacitance varying depending on power of the microwave signal so as to vary a reactance component of the input matching circuit.

According to the present invention, the reactance of the input matching circuit is varied depending on the variations of the input signal power whereby it is possible to effect an impedance matching between the signal source impedance and the first transistor input impedance irrespective of the input signal power variations.

Preferably, the first inductor includes a second transistor having a collector connected to a power source; a resistor disposed to feed a bias current to a base of the second transistor; a second capacitance connected across the base and an emitter of the second transistor; and a second inductor connected across the emitter of the second transistor and the ground; the microwave signal being fed to the emitter of the second transistor and fed via the first capacitance to the base of the first transistor.

According to the present invention, the transconductance of the second transistor increases accordingly as the input signal power increases, so that the first inductor lowers with increase of the input signal power. Thus, the first inductor becomes smaller accordingly as the input signal power increases whereby the impedance matching of the input matching circuit can be kept even when the input signal power has increased.

Preferably, the first capacitance includes a third transistor having a base and a collector that are connected to each other, with a bias current flowing between the base and an emitter of the third transistor, and the microwave signal is input to the emitter of the third transistor, the microwave signal is output from the base and collector of the third transistor to the base of the first transistor.

Preferably, the first capacitance includes a fourth transistor having an emitter and a collector that are connected to each other, with a bias current flowing between a base and the emitter and between the base and the collector of the fourth transistor, and the microwave signal is input to the emitter and the collector of the fourth transistor, the microwave signal is output from the base of the fourth transistor to the base of the first transistor.

According to the present invention, an increase of the input signal power results in an increased capacitance component as a result of thinning of the depletion layer in the forward bias of the first capacitance. Thus, in the event that the input signal power has increased with the lowered input impedance of the first transistor, it is possible to increase the value of the first capacitance and thereby to keep the impedance matching between the signal source internal impedance and the first transistor input impedance.

BRIEF DESCRIPTION OF THE DRAWINGS

The above and other objects, aspects, features and advantages of the present invention will become more apparent from the following detailed description when taken in conjunction with the accompanying drawings, in which.

DESCRIPTION OF THE PREFERRED EMBODIMENTS

The present invention will now be described with reference to the accompanying drawings which illustrate a presently preferred embodiment in a non-limitative manner, i.e., in such a manner as not to limit the technical scope of the present invention.

Figure 1:
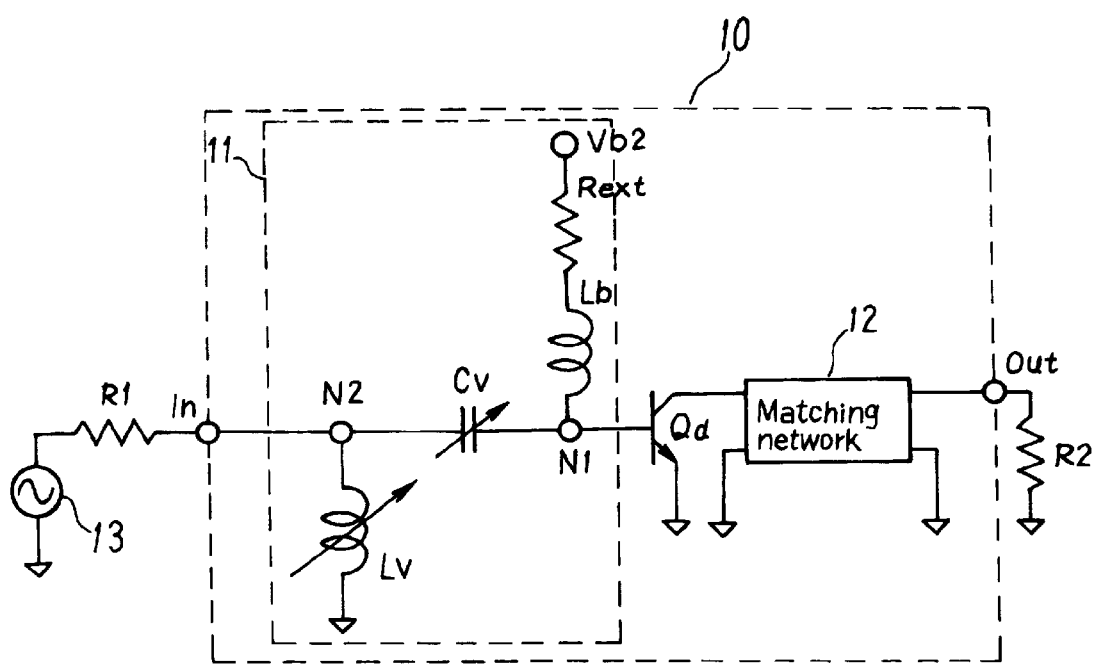
FIG. 1 is an explanatory diagram of the principle of a microwave amplifier in accordance with an embodiment of the present invention.

Referring first to FIG. 1, a principle explanatory diagram is depicted of a microwave amplifier in accordance with the embodiment of the present invention. The microwave amplifier 10, similar to the conventional one, comprises a transistor Qd, for signal amplification, an input matching circuit 11 and an output matching circuit 12.

A microwave signal output from a signal source 13 is fed via an internal impedance R1 of the signal source 13 to an input terminal In of the microwave amplifier 10. The microwave signal input to the input terminal In is fed via the input matching circuit 11 to a base of the transistor Qd. The microwave signal is amplified by the transistor Qd for output from a collector. The microwave signal is then fed via the output matching circuit 12 and through an output terminal Out to a load R2.

The transistor Qd is a bipolar junction transistor or a hetero bipolar transistor (HBT) having a hetero junction between its emitter and base, although a field effect transistor such as a MOS FET is also available as long as the input matching circuit 11 has a terminal N1 provided with an outflow path for biasing current.

The input matching circuit 11 includes a variable inductor Lv disposed between a terminal N2 and the ground, with a variable capacitance Cv intervening between the terminals N2 and N1. Between the terminal N1 and a bias power source Vb2 is interposed a series circuit that consists of a fixed inductor Lb and a resistor Rext. The input matching circuit 11 is comprised of a single-stage π circuit, although it may be formed of a multi-stage π circuit.

The fixed inductor Lb may not make up a part of the π circuit, but instead it may be set to a value that provides an enough large impedance for signal components to thereby cut off the signal components so that only the bias current to the transistor Qd can flow therethrough.

Similar to the input matching circuit 11, the output matching circuit 12 may also include the variable inductor Lv and the variable capacitance Cv so that irrespective of variations in the signal powers matching can be kept between the output impedance of the transistor Qd and the impedance of the load R2. Due to relatively small variations of the transistor output impedance, however, it may be formed from only a fixed inductor and a fixed capacitance.

Figure 2:
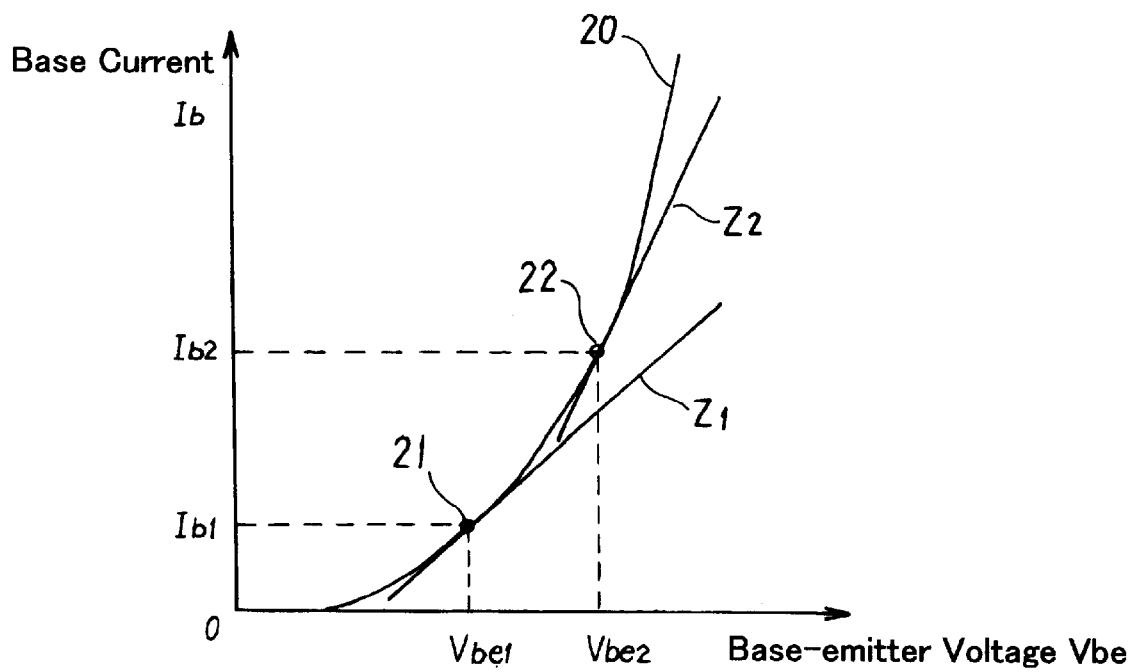
FIG. 2 is a characteristic diagram of a transistor.

Referring then to FIG. 2, a characteristic diagram is depicted of a base-emitter voltage Vbe and a base current Ib of the transistor Qd of the microwave amplifier 10. In the microwave amplifier 10 of this embodiment, as described above, the transistor Qd is set as a class AB that allows a slight bias current to flow therethrough even when no signals are issued. For example, assume in the characteristic diagram of FIG. 2 that the transistor Qd is set to a bias point 21 at which the base-emitter voltage is Vbe1 with the bias current of Ib1. In this case, an input impedance Z1 of the transistor Qd is given as the gradient of a tangent at the bias point 21 of a graph 20.

A case is then considered where the transistor Qd has an increased input signal power. In such a case, the class AB allows only a signal component on one hand to increase so as to raise the average value of the bias current. For this reason, the bias point of the transistor Qd migrates to a bias point 22 at which the base-emitter voltage is Vbe2 with the bias current of Ib2. Then, due to the exponential variations of the graph 20, the bias point 22 has an input impedance Z2 lower than the input impedance Z1 at the bias point 21.

In such an event, as depicted in FIG. 1, by virtue of the series insertion of the resistor Rext into the fixed inductor Lb through which the bias current flows, the microwave amplifier 10 of this embodiment is able to restrict the increase of the bias current in spite of an increase of the input signal power. It is thus possible to restrict the lowering of the input impedance of the transistor Qd arising from the increase of the input signal power to thereby keep the impedance matching irrespective of any increase of the input signal power.

In FIG. 2, the base-emitter voltage may be applied through an emitter follower from a different voltage source by way of a base resistance. In this case, the base resistance has a value of about Rext x hfe, where hfe is a common-emitter current amplification factor of the transistor Qd.

The microwave amplifier 10 of this embodiment may further be arranged as shown in FIG. 1 such that the variable inductor Lv and the variable capacitance Cv of the input matching circuit 11 are varied depending on the variations of the input signal power so that the impedance matching is achieved between the internal impedance R1 of the signal source 13 and the input impedance of the transistor Qd irrespective of the input signal power variations.

That is, an increase of the input signal power results in a lowering of the input impedance of the transistor Qd. For this reason, when the input signal power is increased, the input matching circuit 11 of this embodiment reduces the value of the variable inductor Lv or increases the value of the variable capacitance Cv.

On the contrary, a lowering of the input signal power leads to an increase of the input impedance of the transistor Qd. In consequence, when the input signal power is lowered, the input matching circuit 11 increases the value of the variable inductor Lv or reduces the value of the variable capacitance Cv.

According to the microwave amplifier 10 of this embodiment in this manner, the reactance of the input matching circuit 11 is varied depending on variations of the input signal power whereby the impedance matching is achieved between the internal impedance R1 of the signal source 13 and the input impedance of the transistor Qd irrespective of the input signal power variations. Either the variable inductor Lv or the variable capacitance Cv can be varied as a function of the input signal power variations, but instead both of them may be varied.

Figure 3A:
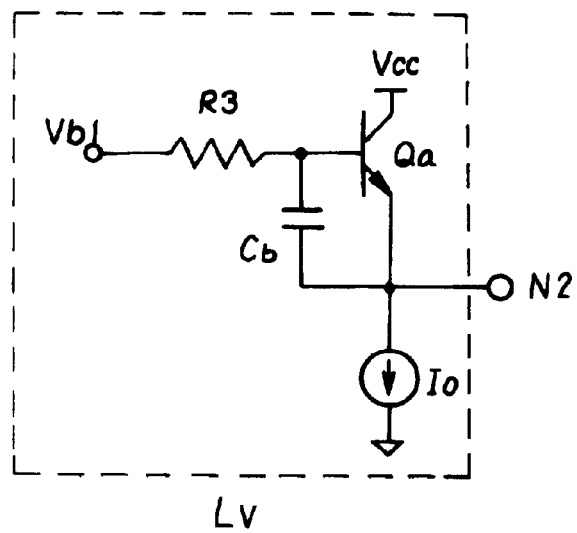
FIGS. 3A and 3B are explanatory diagrams of a variable inductor in the embodiment of the present invention.
Figure 3B:
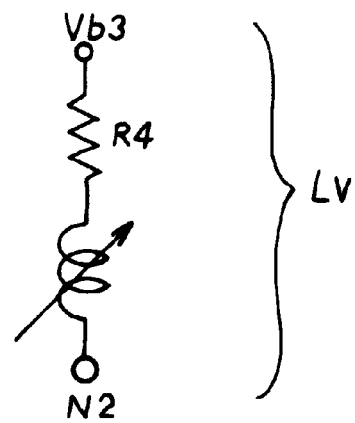

FIGS. 3A and 3B are explanatory diagrams of the variable inductor Lv in this embodiment. The variable inductor Lv comprises, as depicted in FIG. 3A, a transistor Qa whose collector is connected to a drive power source Vcc, a resistor R3 interposed between a base of the transistor Qa and a bias power source Vb1, and a capacitor Cb disposed between a base and an emitter of the transistor Qa.

The transistor Qa has an emitter terminal N2 that connects with the terminal N2 of the input matching circuit 11 of FIG. 1. This allows signal powers input to the microwave amplifier 10 to be fed through the terminal N2 to the variable inductor Lv. In FIG. 3A, current Io represents combined signal current fed through the terminal N2 and bias current of the transistor Qa.

In FIG. 3A, an input signal supplied to the terminal N2 is fed by the capacitor Cb to the base of the transistor Qa. Let Ibo be a low-frequency component of the bias current of the transistor Qa, and Vbac be a signal voltage input through the terminal N2, then the signal voltage Vbac is voltage divided by the resistor R3 and the capacitor Cb. Hence, the base-emitter voltage Vbe of the transistor Qa is given as $$Vbe=(Vbac/j\omega Cb)/(R3+(1/j\omega Cb))+Ibo/gm \quad (1)$$

where gm is a transconductance of the transistor Qa.

If $R3 \gg 1/j\omega Cb$, then the expression (1) is approximated by $$Vbe \approx (Vbac/j\omega CbR3)+Ibo/gm \quad (2)$$

At that time, the current Io flowing through the transistor is given as $$Io=gm \times Vbe \quad (3)$$

When placing the expression (2) in the expression (3), $$Io=gm \times (Vbac/j\omega CbR3)+Ibo=Vbac/j\omega (CbR3/gm)+Ibo \quad (4)$$

results. This corresponds to the connection of the variable inductance Lv=CbR3/gm to the terminal N2. Thus, the variable inductance Lv of FIG. 3A can be depicted as in FIG. 3B with the resistance component represented by the resistor R4.

In FIG. 3B, $$Vb3 \approx Vb1-Ibo/Gm$$

And, Vb3 is smaller than(Vb1-Ibo/Gm) by R3×Ib(Ib is the base current).

In this case, the transconductance gm of the transistor Qa increases accordingly as the current Io increases, so that the variable inductance Lv reduces with increase of the current Io. Thus, the variable inductance Lv becomes smaller accordingly as the input signal power increases, whereupon the input matching circuit 11 can keep its impedance matching irrespective of the increase of the input signal power.

Figure 4A:
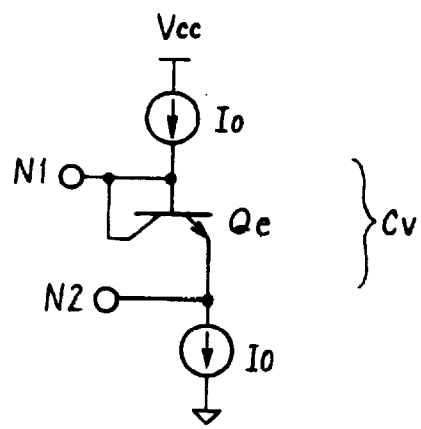
FIGS. 4A to 4C are explanatory diagrams of a variable capacitance in the embodiment of the present invention.
Figure 4B:
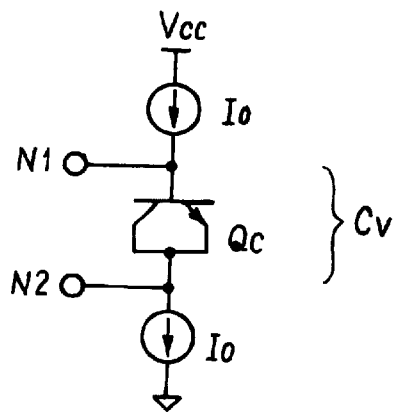
Figure 4C:
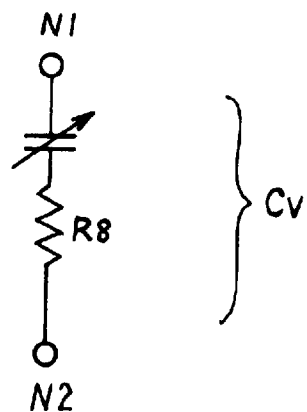

FIGS. 4A to 4C are explanatory diagrams of the variable capacitance Cv in this embodiment. The variable capacitance Cv of FIG. 4A has a terminal N1 that is provided by connecting the base and the collector of the transistor Qe and a terminal N2 in the form of the emitter of the transistor Qe, the terminals N1 and N2 connecting with the terminals N1 and N2 of FIG. 1. The bias current Io is set to such a level as to allow the transistor Qe to slightly conduct.

In FIG. 4A, a forward bias is applied across the base and emitter, so that a capacitive component is possessed by the transistor Qe in a region where the bias current Io is small. In this case, an increase of the signal power applied across the terminals N1 and N2 leads to a thin depletion layer in the forward bias, raising the capacitive component. Thus, an equivalent circuit of FIG. 4A circuit is depicted in FIG. 4C, which acts as the variable capacitance Cv whose capacitive component increases accordingly as the input signal power increases. In FIG. 4C, a resistor R8 represents the loss of the variable capacitance Cv.

FIG. 4B depicts the variable capacitance Cv having a terminal N1 in the form of the base of the transistor Qc and a terminal N2 that is provided by connecting the collector and the emitter of the transistor Qc. This variable capacitance Cv has a capacitive component in a region where the bias current Io is small, since a forward bias is applied across the base and emitter and across the base and collector.

In the variable capacitance Cv of FIG. 4B as well, an increase of the signal power applied across the terminals N1 and N2 causes a thinned depletion layer in the forward bias and thus an increased capacitive component. It therefore acts as a variable capacitance Cv whose capacitive component increases accordingly as the input signal power increases.

According to the variable capacitance Cv of this embodiment, it is thus possible, when the input impedance of the transistor Qd lowers as a result of increase of the input signal power, to increase the value of the variable capacitance Cv and to keep the impedance matching between the internal impedance of the signal source 13 and the input impedance of the transistor Qd.

Figure 5:
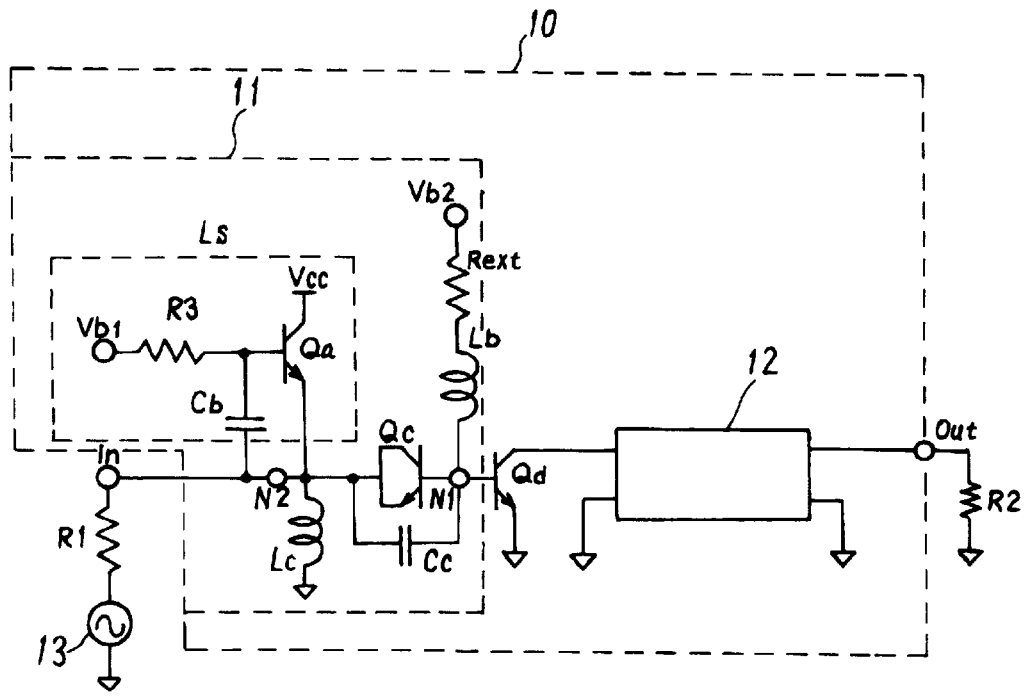
FIG. 5 is a circuit diagram of a microwave amplifier in accordance with a first embodiment of the present invention.

FIG. 5 is a circuit diagram of a microwave amplifier in accordance with a first embodiment of the present invention. In the same manner as the case of FIG. 1, the input matching circuit 11 of the microwave amplifier 10 of this embodiment is configured as a single-stage $\pi$ circuit with a variable inductor Lv that is comprised of a parallel circuit including the variable inductor Ls similar to FIG. 3A and the fixed inductor Lc. In this case, the fixed inductor Lc has one end that is grounded to provide an outflow path for the bias current.

The value of the variable inductor Ls can be adjusted by the value of the capacitor Cb. Although the capacitor Cb could be substituted by a parasitic capacitance across the base and emitter of the transistor Qa, an external capacitor may be provided to reduce the size of the transistor Qa.

The variable capacitance Cv can be a parallel circuit including the variable capacitance Qc as depicted in FIG. 4B and a fixed capacitance Cc. The variable capacitance Qc is formed from a transistor junction capacitance, so that a larger junction area is needed to increase the capacitance value, resulting in a larger loss thereat. Thus, the variable capacitance Qc is set to a minimum value required for the capacitance variances, with the other capacitance components being borne by a fixed capacitance Cc such as a ceramic capacitor having a less loss. The variable capacitance Qc is subjected to a voltage of a level allowing a slight flow of the bias current therethrough by the bias voltage source Vb2 and the fixed inductor Lc whose one end is grounded.

The variable capacitance contributes to the temperature compensation of the transistor Qd. That is, the variable capacitance Qc is comprised of a transistor having the same temperature characteristic as the transistor Qd, and hence the base-emitter junction of the variable capacitance Qc has the same temperature characteristics as the base-emitter junction of the transistor Qd. It is therefore possible to drop the base voltage of the transistor Qd with the rise of the temperature and to restrict the increase of the collector current through the transistor Qd.

The bias power sources Vb1 and Vb2 can be a single bias power source. When the transistor Qd is an Si BJT, it is of the order of 0.6 to 1.0V, whereas for an InGaP/GaAs HBT it is of the order of 1.2 to 1.6V.

Thus, according to the microwave amplifier 10 of this embodiment, the bias current of the transistor Qd is fed from the bias power source Vb2 through the resistor Rext and the fixed inductor Lb. Accordingly, even in the event of the increased input signal power, the input impedance of the transistor is restrained from lowering, enabling a satisfactory impedance matching to be made irrespective of the variations of the input signal power. Furthermore, due to restriction on the increase of the bias current, any increase can be restricted in the power consumption of the microwave amplifier 10.

According to the microwave amplifier 10 of this embodiment, the variable inductance Ls and the variable capacitance Qc of the input matching circuit 11 are varied depending on the variations of the input signal power, whereby the impedance matching can be achieved between the internal impedance R1 of the signal source 13 and the input impedance of the transistor Qd.

Figure 6:
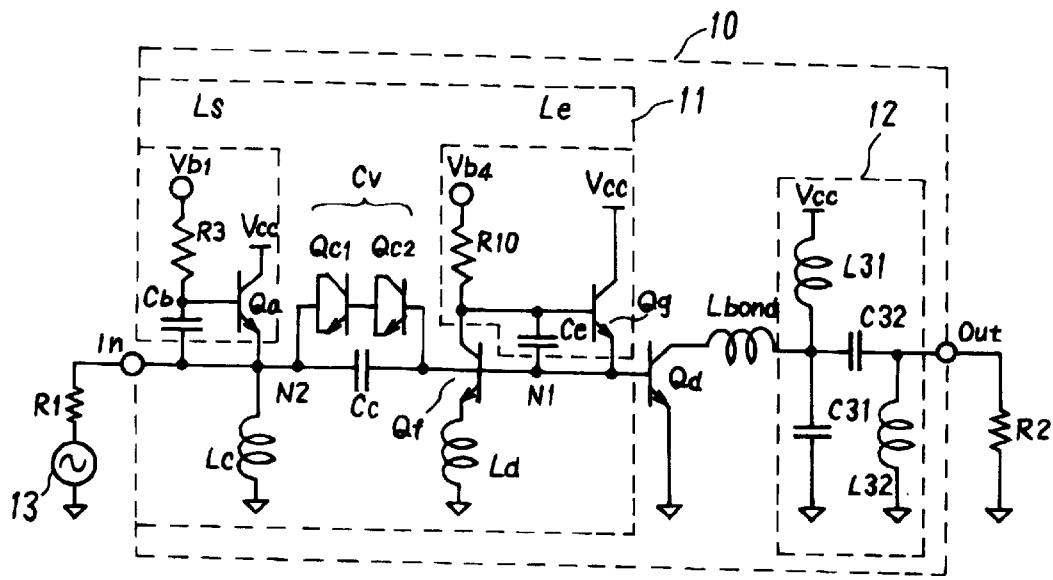
FIG. 6 is a circuit diagram of a microwave amplifier in accordance with a second embodiment of the present invention.

FIG. 6 is a circuit diagram of a microwave amplifier in accordance with a second embodiment of the present invention. The microwave amplifier 10 of this embodiment comprises the input matching circuit 11 in the form of the single-stage $\pi$ circuit similar to the first embodiment. It is to be noted however that the fixed inductor Lb and the resistor Rext of the first embodiment are replaced by a variable inductor Le that is made up of a transistor Qg, a resistor R10 and a capacitor Ce. In this case, a collector of the transistor Qg is connected to the power source Vcc, with one end of the resistor 10 being connected to a bias power source Vb4.

In the input matching circuit 11 of this embodiment, the variable capacitance Cv is comprised of a parallel connection of series connected transistors Qc1 and Qc2 with the fixed capacitance Cc. The series connection of the transistors Qc1 and Qc2 reduces the bias voltage applied to the junction face to thereby reduce the signal loss in the variable capacitance Cv.

The input matching circuit 11 of this embodiment comprises a transistor Qf having a collector connected to the resistor R10 and a base connected to the terminal N1, the transistor Qf having an emitter connected to the fixed inductor Ld whose one end is grounded. In this embodiment, the transistor Qf provides a temperature compensation for the transistor Qd. Since the transistor Qf is comprised of a transistor having the same temperature characteristics as the transistor Qd, the base-emitter junction of the transistor has the same temperature characteristics as the base-emitter junction of the transistor Qd. It is thus possible to drop the base voltage of the transistor Qd with the rise of the temperature to thereby restrict any increase of the collector current through the transistor Qd.

The input matching circuit 11 of this embodiment allows a logarithm of an envelope voltage of the input signal in the form of an amplitude modulated wave to be applied as the bias voltage of the transistor Qd. That is, the voltage gain of the transistor Qf is determined by the product of a transconductance gm and the resistance R10, so that if the voltage gain is sufficiently large, then the transistor Qf can be regarded as an ideal amplifier having the base-emitter junction of the transistor Qg in a feedback loop. Herein, the relationship between the emitter current Ie and the base-emitter voltage Vbe of the transistor Qg is expressed by $$Ic = Ico \times \exp(Vbe - \phi b) \tag{5}$$

where Ieo is an initial value of the emitter current Ie and $\phi b$ is a constant indicative of a phase lag. When acquiring the logarithms of both sides of the expression (5), $$Vbe = \phi b + \ln(Ie/Ieo) = \phi b + Vo \times \ln(Ie) \tag{6}$$

Accordingly, the base-emitter voltage Vbe of the transistor Qg varies depending on the logarithm of the emitter current Ie. In this case, the emitter current Ie corresponds to the base current of the transistor Qd and varies depending on the envelope voltage of the input signal.

Due to such variations of the base-emitter voltage of the transistor Qg depending on the logarithm of the input signal envelope voltage, the base voltage of the transistor Qd also varies depending on the logarithm of the input signal envelope voltage. Thus, even in the event of increase of the input signal power, it is possible to suppress increase in the bias current of the transistor Qd to thereby restrain the input impedance of the transistor Qd from lowering.

The output matching circuit 12 of this embodiment comprises fixed inductors L31 and L32 and fixed capacitances C31 and C32. A signal output from the collector of the transistor Qd is input via a bonding wire inductor Lbond to the output matching circuit 12 and is fed from an output terminal Out to a load R2.

According to the microwave amplifier 10 of the second embodiment in this manner, the input impedance of the transistor Qd is restrained from lowering even in the event of increase of the input signal power, enabling a satisfactory impedance matching to constantly be made irrespective of the input signal power variations. Furthermore, restriction on increase of the bias current enables the increased power consumption of the microwave amplifier 10 to be restricted.

According to the microwave amplifier 10 of this embodiment, the variable inductors Ls, Le and the variable capacitance Cv of the input matching circuit 11 are varied depending on the variations of the input signal power so that impedance matching is achieved between the internal impedance R1 of the signal source 13 and the input impedance of the transistor Qd irrespective of the input signal power variations.

Figure 7:
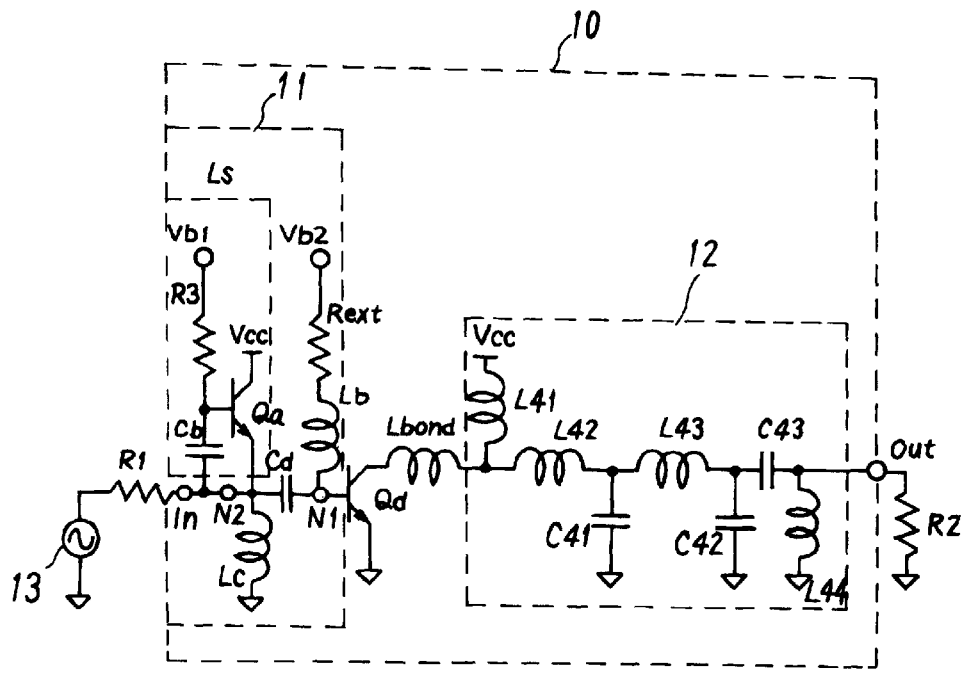
FIG. 7 is a circuit diagram of a microwave amplifier in accordance with a third embodiment of the present invention.
Figure 8:
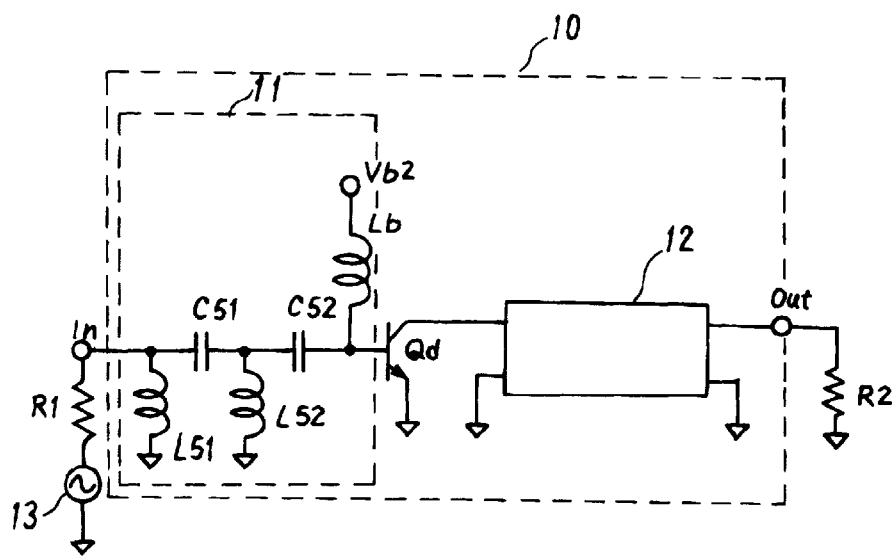
FIG. 8 is a circuit diagram of a conventional microwave amplifier.

FIG. 7 is a circuit diagram of a microwave amplifier in accordance with a third embodiment of the present invention. The microwave amplifier 10 of this embodiment comprises the input matching circuit 11 in the form of the single-stage π circuit similar to the case of the first embodiment but different therefrom in that the variable capacitance Qc is omitted with use of only the fixed capacitance Cd.

The output matching circuit 12 of this embodiment is configured as a band pass matching circuit which includes fixed inductors L41, L42, L43 and L44 and fixed capacitances C41, C42 and C43. A signal output from the collector of the transistor Qd is input via the bonding wire inductor Lbond to the output matching circuit 12 and is fed from the output terminal Out to the load R2. In this embodiment as well, the bias power sources Vb1 and Vb2 may be substituted by a single bias power source.

According to the microwave amplifier 10 of this embodiment, the input impedance of the transistor Qd can be restrained from lowering even when the input signal power has increased so that a satisfactory impedance matching is ensured at all times irrespective of the input signal power variations. Moreover, restriction on increase of the bias current enables a limitation to be imposed on increase in the power consumption of the microwave amplifier 10.

According to the microwave power amplifier 10 of this embodiment, the variable inductance Ls of the input matching circuit 11 is varied depending on variations of the input signal power so that the impedance matching is achieved between the internal impedance of the signal source 13 and the input impedance of the transistor Qd irrespective of the input signal power variations.

In the above microwave amplifiers of the first to third embodiments, the transistors Qa, Qc, etc., making up the variable inductor Lv and the variable capacitance Cv may be formed from a single chip by the same semiconductor process as one for the output transistor Qd.

For example, the transistors Qa, Qc, Qd, etc., may be formed of a bipolar junction transistor or a hetero bipolar transistor using the same semiconductor process so that the low power consuming microwave amplifier can provide small-sized and lightweight hand-held equipment.

According to the present invention, as set forth hereinabove, it is possible to restrict the reduction in the input impedance of the amplifying element even in the event of an increased input signal power, to thereby effect a satisfactory impedance matching at all times irrespective of any input signal power variations. Furthermore, due to the restriction on the increase of the bias current, it is possible to impose a limitation on increase in the power consumption of the microwave amplifier.

While illustrative and presently preferred embodiments of the present invention have been described in detail herein, it is to be understood that the inventive concepts may be otherwise variously embodied and employed and that the appended claims are intended to be construed to include such variations except insofar as limited by the prior art.

What is claimed is:

1. A microwave amplifier comprising:

a first transistor arranged to amplify a microwave signal fed from a signal source to a base of said first transistor; and an input matching circuit in the form of an LC circuit interposed between said signal source and said base of said first transistor, said input matching circuit effecting an impedance matching between impedance of said signal source and input impedance of said first transistor, said input matching circuit including a first inductor and a first capacitance, either said first inductor or said first capacitance varying depending on power of said microwave signal so as to vary a reactance component of said input matching circuit.

2. A microwave amplifier according to claim 1, wherein said input matching circuit includes a series circuit including an inductor and a resistor for feeding a bias current to said base of said first transistor.

3. A microwave amplifier according to claim 1, wherein said first inductor includes:

a second transistor having a collector connected to a power source;

a resistor disposed to feed a bias current to a base of said second transistor;

a second capacitance connected across said base and an emitter of said second transistor; and a second inductor connected across said emitter of said second transistor and the ground;

said microwave signal being fed to said emitter of said second transistor and fed via said first capacitance to said base of said first transistor.

4. A microwave amplifier according to claim 1, wherein said first capacitance includes a third transistor having a base and a collector that are connected to each other, with a bias current flowing between said base and an emitter of said third transistor, and wherein said microwave signal is input to said emitter of said third transistor, said microwave signal is output from said base and collector of said third transistor to said base of said first transistor.

5. A microwave amplifier according to claim 1, wherein said first capacitance includes a fourth transistor having an emitter and a collector that are connected to each other, with a bias current flowing between a base and said emitter and between said base and said collector of said fourth transistor, and wherein said microwave signal is input to said emitter and said collector of said fourth transistor, said microwave signal is output from said base of said fourth transistor to said base of said first transistor.

* * * * *